United States Patent
Yang et al.

(10) Patent No.: US 7,056,821 B2
(45) Date of Patent: Jun. 6, 2006

(54) METHOD FOR MANUFACTURING DUAL DAMASCENE STRUCTURE WITH A TRENCH FORMED FIRST

(75) Inventors: Chin-Tien Yang, Hsinchu (TW); Juan-Jann Jou, Tainan Hsien (TW); Yu-Hua Lee, Hsinchu (TW); Chia-Hung Lai, Hsinchu (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 29 days.

(21) Appl. No.: 10/919,328

(22) Filed: Aug. 17, 2004

(65) Prior Publication Data
US 2006/0040498 A1    Feb. 23, 2006

(51) Int. Cl.
*H01L 21/4763*  (2006.01)
*H01L 21/44*  (2006.01)
(52) U.S. Cl. ............... 438/618; 438/678; 438/623; 438/638
(58) Field of Classification Search ........... 438/678, 438/706, 638, 618, 633, 623, 790
See application file for complete search history.

(56) References Cited

U.S. PATENT DOCUMENTS

| 6,924,228 B1 * | 8/2005 | Kim et al. ............... 438/636 |
| 2005/0014361 A1 * | 1/2005 | Nguyen et al. ............ 438/623 |

* cited by examiner

*Primary Examiner*—Michael Lebentritt
(74) *Attorney, Agent, or Firm*—Hoffman, Wasson & Gitler

(57) ABSTRACT

A method for manufacturing a dual damascene structure, which forms a trench first, is described. The manufacturing method has following steps. First, a substrate with a plurality of semiconductor devices is provided. A first metal layer, a first etching stop layer, a dielectric layer, and a second etching stop layer are subsequently formed thereon. A trench is formed in the dielectric layer at a predetermined depth thereafter, and a sacrificial layer is filled therein and is next planarized. Then a photoresist layer is formed thereon for etching a via. Afterward the photoresist layer and the sacrificial layer are both removed. Following that, the first etching stop layer is etched through to expose the first metal layer. Finally, the via and the trench are filled with a second metal layer.

14 Claims, 6 Drawing Sheets

METHOD FOR MANUFACTURING DUAL DAMASCENE STRUCTURE WITH A TRENCH FORMED FIRST

FIELD OF THE INVENTION

The present invention relates to a method of manufacturing a dual damascene structure, and more particularly, to a method of manufacturing a dual damascene structure with a trench formed first.

BACKGROUND OF THE INVENTION

The manufacture of integrated circuits (ICs) usually adopts multilevel interconnects to build up 3-D interconnection structures in highly dense devices, as IC device performance extends to higher levels. In devices, the metal lines of the first layer are generally electrically coupled to the drains/sources of devices through vias, and the interconnects between the devices are coupled by the metal lines of other layers. On the other hand, the multilevel interconnects between the metal lines are separated by inter-metal dielectric (IMD) layers, while the respective metal layers are connected by via plugs. The dual damascene process is currently developed for forming via plugs and metal interconnects at the same time.

As to the metals, copper is gradually being substituted for aluminum, because copper comprises the properties of a high melting point and a low resistance (about 1.7 $\mu\Omega$-cm), and is more capable of preventing electro-migration. However, copper itself is inclined to oxidize and tends to react with other materials at low temperatures. Further, no effective dry etching process exists for copper. Nevertheless, these issues are overcome by improved diffusion barrier materials and progressive processes, such as damascene process, and chemical mechanical polishing (CMP).

FIGS. 1A–1E illustrate a conventional method of manufacturing dual damascene. Referring to FIG. 1A, a semiconductor substrate 101 with a plurality of semiconductor devices (not shown) is provided. A metal layer 103, a first etching stop layer 107, an inter-metal dielectric layer 109, and a second etching stop layer 111 are subsequently formed thereon. A photoresist layer 113 is then coated and patterned to define the position of a via.

The via 116 is formed by etching the second etching stop layer 111, the inter-metal dielectric layer 109, and the first etching stop layer 107, as illustrated in FIG. 1B. In this step, the metal layer 103 has been exposed to air. As a result, a baking step should now be performed to prevent the metal layer 103 oxidation. After that, a sacrificial layer 115 is filled therein.

In turn, the sacrificial layer 115 is etched back, and a photoresist layer 117 is next coated thereon, as shown in FIG. 1C. Referring to FIG. 1D and FIG. 1E, the photoresist layer 117 is patterned and etched to form a trench 118. After the photoresist layer 117 and the sacrificial layer 115 are removed, a metal layer 119 is then filled therein.

According to the aforementioned description, the conventional method for manufacturing dual damascene is to form a trench following a via. This method, however, conceals some problems. As mentioned above, the metal layer 103 has been exposed to air before the sacrificial layer 115 is filled therein. Using copper as the metal layer dramatically affects the quality of the devices, since copper is inclined to oxidize. Therefore the queue time (Q-time) should be controlled precisely.

Moreover, micro trenches 203 and fences 201 issues commonly occur in the conventional process, as shown in FIG. 2, that affect the subsequent processes. For example, fences cause poor coverage capability of barrier layers and electrochemical plating (ECP) deposition. Fences, for instance, further result in unsteady electrical properties, as well as poor reliability of devices.

In addition, the dielectric layer 109 is generally constituted by porous low-k materials, through which residual NH-group components in the substrate readily pass to neutralize with the photoresist layer, and consequently react to be photoresist scum. Therefore the photoresist is not developed and patterned well, which also leads to a decrease in the production yield.

SUMMARY OF THE INVENTION

One of the objectives of the present invention is to provide a method for manufacturing a dual damascene structure with a trench formed first, in order to reduce Q-time when copper is exposed to the air and also to simplify the process by omitting a post-baking step following etching a via.

Another objective of the present invention is to improve the surface quality of the photoresist layer for etching a via by planarizing the sacrificial layer. The photolithography process thus has a wider control window.

Yet another objective of the present invention is to provide a method for manufacturing a dual damascene structure with a trench formed first. No photoresist scum issue is caused by neutralization of the photoresist with NH— group components due to the greater open area of the trench. The photoresist is therefore patterned and transferred more clearly and more precisely.

Yet another objective of the present invention is to provide a method for reducing micro trenches and fences by means of a sacrificial layer with substantially the same etching rate selectivity as an inter-metal dielectric layer; both of which and the photoresist are consequently easily stripped by a wet or dry cleaning process or by a wet or dry etching process.

According to the aforementioned objectives of the present invention, a method for manufacturing a dual damascene structure with a trench formed first is provided. The method of manufacture has the following steps. First, a substrate with a plurality of semiconductor devices is provided. A first metal layer, a first etching stop layer, a dielectric layer, a second etching stop layer, and a first patterned photoresist layer are subsequently formed thereon. The first patterned photoresist layer is used as a mask, and a trench is then formed by etching through the second etching stop layer and stopping in the dielectric layer at a predetermined depth. The trench is filled with a sacrificial layer thereafter and is next planarized. Then a second patterned photoresist layer is formed thereon as a mask for etching a via. The second patterned photoresist layer and the sacrificial layer are then both removed. The first etching stop layer is next etched through to expose the first metal layer. A second metal layer is subsequently filled therein and is also planarized.

The first metal layer and the second metal layer discussed above comprise copper, while the dielectric layer comprises fluorinated silicate glass (FSG), silicon dioxide, black diamond (BD), SiLK, CORAL, methyl silsesquioxane (MSQ), or hydrogen silsesquioxane (HSQ), of which the dielectric constant is preferably from about 1.0 to about 4.0.

The predetermined depth of the trench discussed above is preferably less than the thickness of the dielectric layer, yet the sacrificial layer is 0.5–1.5 times the thickness of the dielectric layer. The etching rate ratio of the sacrificial layer to the dielectric layer, moreover, is around 0.7:1 to 1.3:1. On the other hand, the second patterned photoresist layer and the dielectric layer are separated by the sacrificial layer and the second etching stop layer to prevent the photoresist layer from contacting NH— group components. Additionally, the photoresist layer is positioned on the sacrificial layer that has been planarized, so the photoresist layer is more capable of being patterned and transferred.

The method for manufacturing a dual damascene structure with a trench formed first in accordance with the present invention not only reduces the Q-time when copper is exposed to the air, but also eliminates one step of baking, by which the process is effectively simplified. Furthermore, the problems of micro trenches and fences, as well as the issue of neutralization of the photoresist layer with the NH— group components are successfully solved; as a result, the control window of the photolithography process is increased.

BRIEF DESCRIPTION OF THE DRAWINGS

The foregoing aspects and many of the attendant advantages of this invention will become more apparent by reference to the following detailed description, when taken in conjunction with the accompanying drawings, wherein.

DETAILED DESCRIPTION OF THE
PREFERRED EMBODIMENTS

A method for manufacturing a dual damascene structure with a trench formed first is disclosed in the invention, in order to reduce Q-time when copper is exposed to the air to shorten the process, to increase development ability of the photoresist to increase the control windows of the photolithography process, and also to eliminate the problems of micro trenches and fences. As a result, the productivity and the yield of semiconductor devices are effectively improved in accordance with the invention. The making and using of the preferred embodiment of the present invention are discussed in detail below with reference to drawings. It should be appreciated, however, those skilled in the art would make and use in a wide variety ways of the present invention without departing from the spirit and the scope of the invention.

Figure 1A:
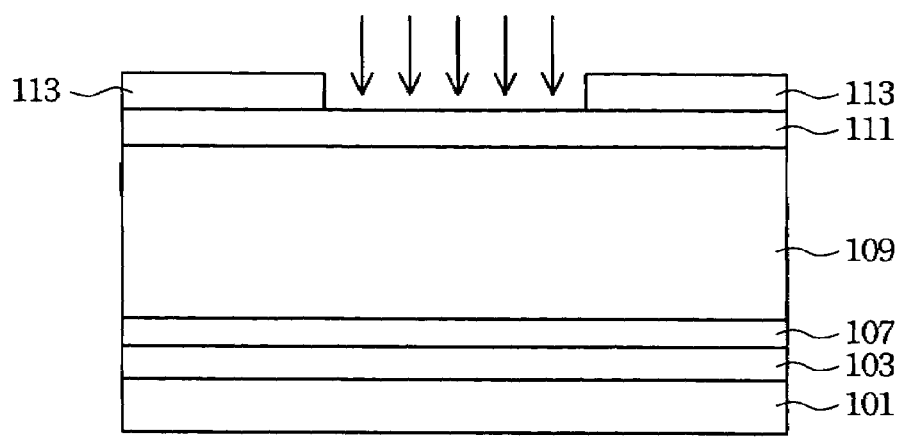
FIGS. 1A–1E illustrate cross-sectional views of various stages of a method for manufacturing dual damascene in the prior art.
Figure 1B:
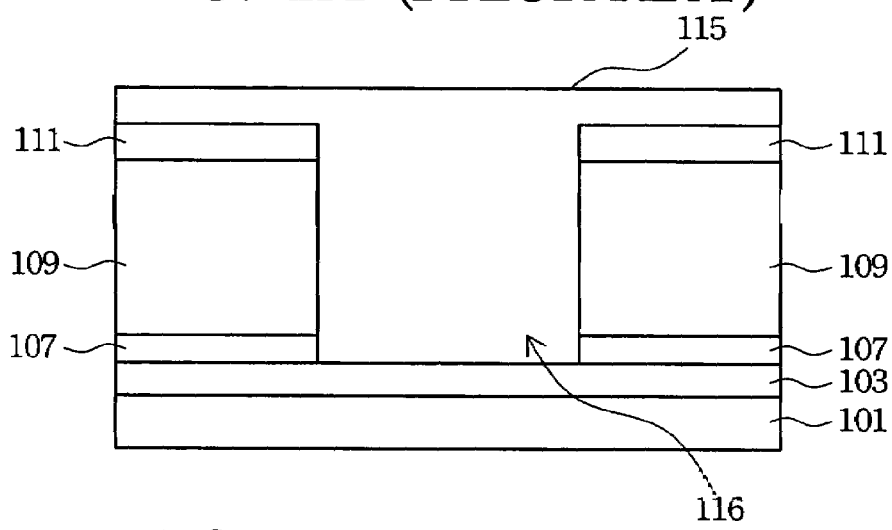
Figure 1C:
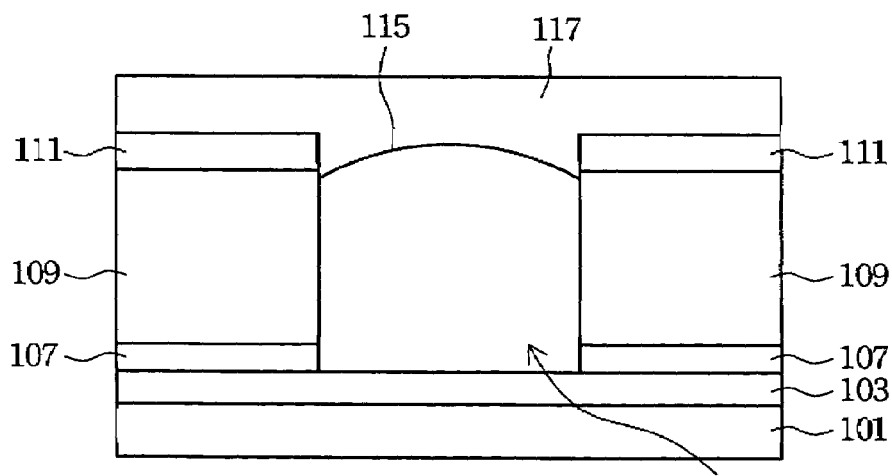
Figure 1D:
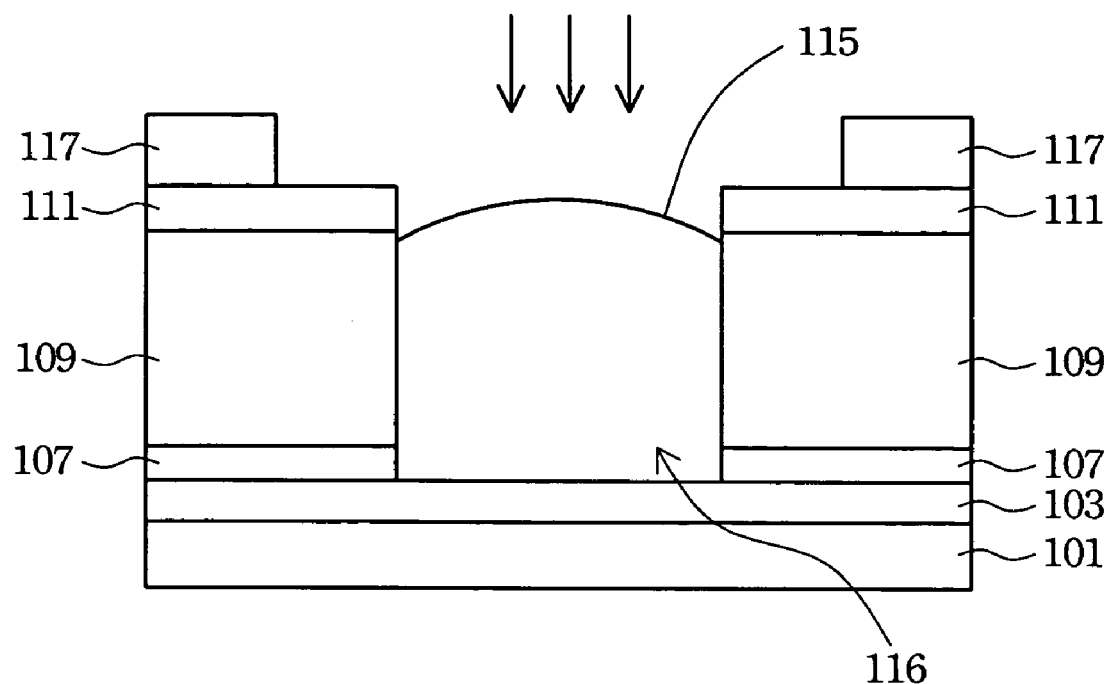
Figure 1E:
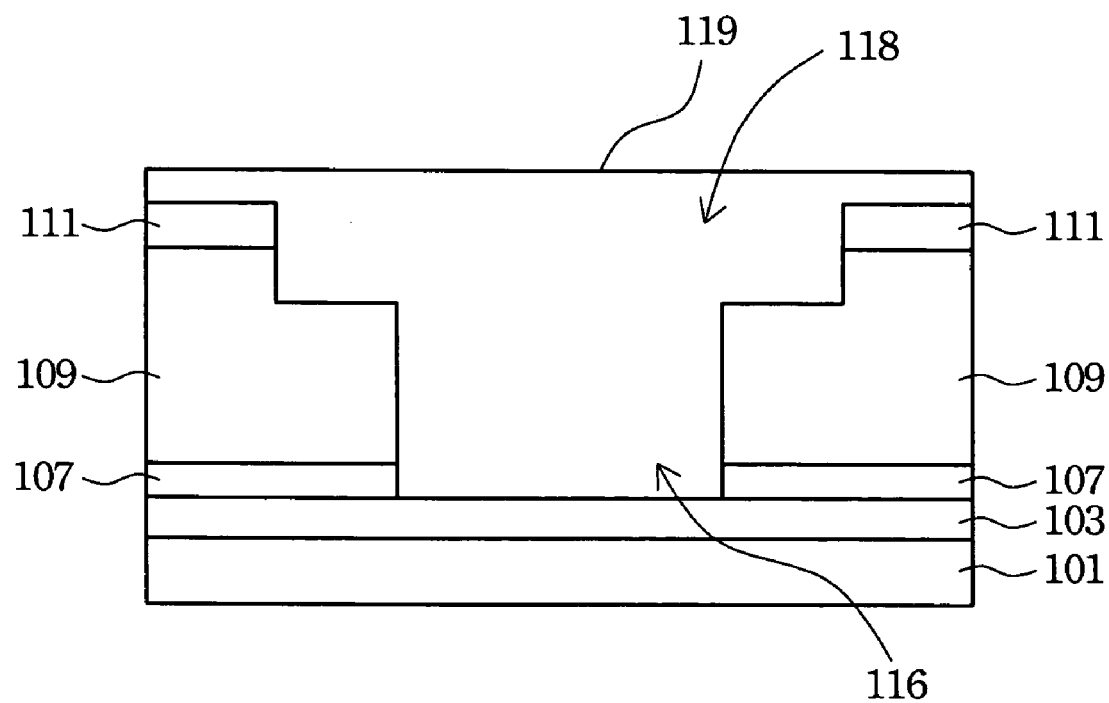
Figure 2:
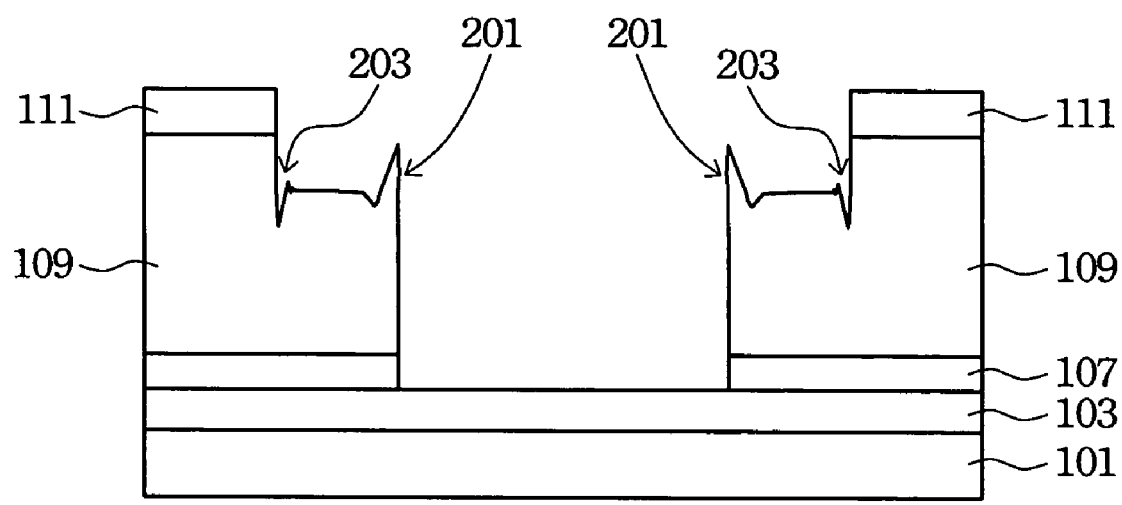
FIG. 2 illustrates the phenomena of micro trenches and fences in the prior art.
Figure 3A:
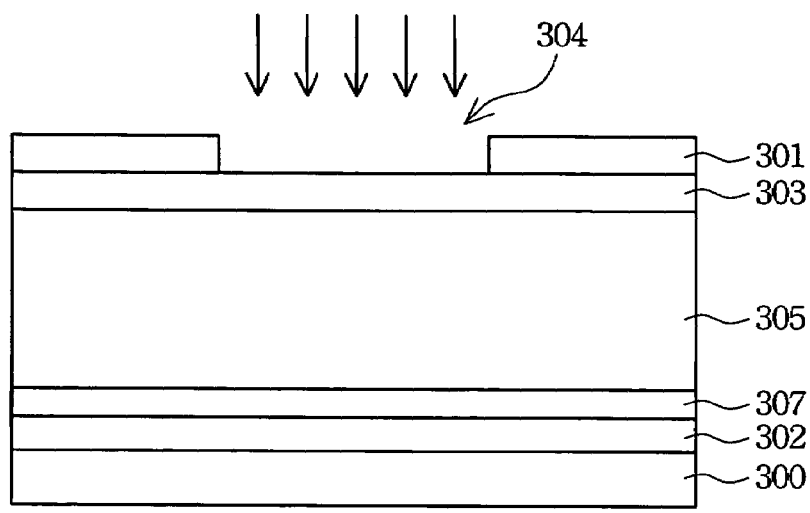
FIGS. 3A–3H illustrate cross-sectional views of various stages of manufacturing a dual damascene structure with a trench formed first in accordance with the present invention.

FIGS. 3A–3H illustrate a preferred embodiment of manufacturing a dual damascene structure with a trench formed first in accordance with the present invention. Referring to FIG. 3A, a semiconductor substrate 300 is provided, which has a plurality of semiconductor devices (not shown). A first metal layer 302, a first etching stop layer 307, an inter-metal dielectric layer 305, and a second etching stop layer 303 are subsequently formed thereon. A photoresist layer 301 is then coated on and patterned to form an open area 304. The inter-metal dielectric layer 305 may be made of inorganic or organic dielectric materials. The inorganic dielectric materials, for example, comprise fluorinated silicate glass (FSG) with a dielectric constant of around 3.5, hydrogen silsesquioxane (HSQ) with a dielectric constant of around 2.8, and silicon dioxide. The organic dielectric materials comprise, for example, methyl silsesquioxane (MSQ) with a dielectric constant of around 2.7 and the like. Other low-k dielectric materials, such as black diamond (BD), SiLK, and CORAL, are also candidates for forming an inter-metal dielectric layer 305.

Figure 3B:
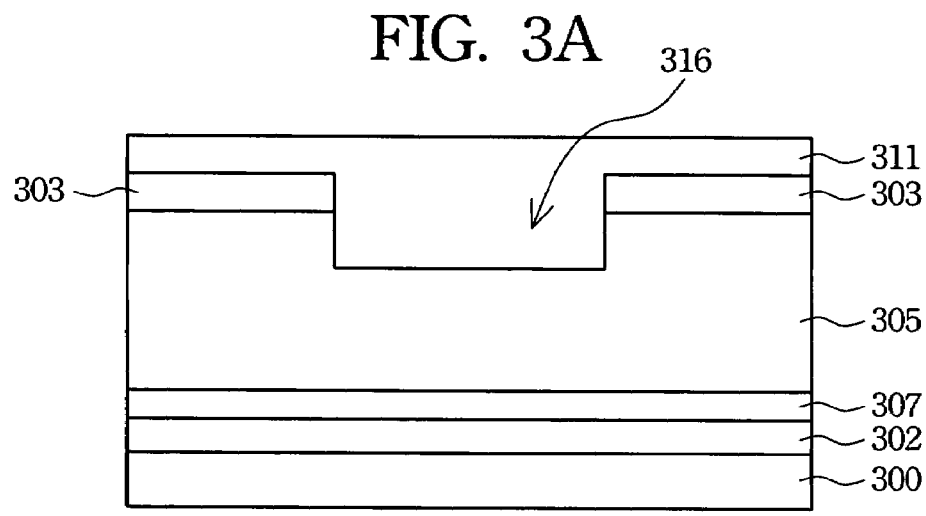

Referring to FIG. 3B, the patterned photoresist layer 301 is used as a mask for an etching process, and consequently a trench 316 is formed by etching the second etching stop layer 303 and the inter-metal dielectric layer 305 and stopping therein at a predetermined depth. Usually the depth of the trench 316 is preferably less than the thickness of the inter-metal dielectric layer 305. The trench 316 is then filled with a sacrificial layer 311 by a spin-on process or chemical vapor deposition. The sacrificial layer 311 may be made of organic or inorganic materials, and its thickness is 0.5–1.5 times that of the inter-metal dielectric layer 305. The sacrificial layer 311 is further removed by, for example, wet or dry ashing process, or wet or dry cleaning process without damaging the inter-metal dielectric layer 305. In addition, the etching rate selectivity ratio of the sacrificial layer 311 to the inter-metal dielectric layer 305 is about 0.7:1 to 1.3:1; therefore the conventional issues, such as fences, micro trenches, and facets, are effectively solved due to the substantially identical etching rates of the inter-metal dielectric layer 305 and the sacrificial layer 311. Furthermore, the anterior first etching stop layer 307 is, for example, a diffusion-barrier layer; the second etching stop layer 303 is a hard mask layer or an anti-reflection layer.

Figure 3C:
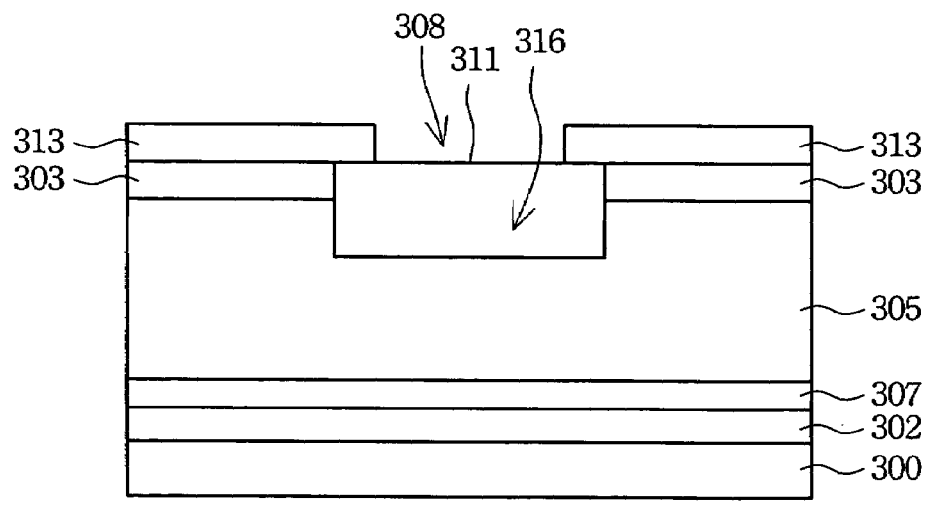

The sacrificial layer 311 is next planarized to the thickness of the second etching stop layer 303, as shown in FIG. 3C, and a photoresist layer 313 is thereafter coated on the sacrificial layer 311 and the second etching stop layer 303. An open area 308 is formed to expose the sacrificial layer 311 by patterning the photoresist layer 313. As the photoresist layer 313 is formed uniformly owing to the sacrificial layer 311 being planarized, the control windows of the photolithography process are sufficiently increased. Furthermore, the photoresist layer 313 and the inter-metal dielectric layer 305 are separated by the sacrificial layer 311 and the second etching stop layer 303, such that the photoresist layer 313 does not contact the inter-metal dielectric layer 305 directly. The photoresist layer 313 is thus more capable of being patterned and transferred.

Figure 3D:
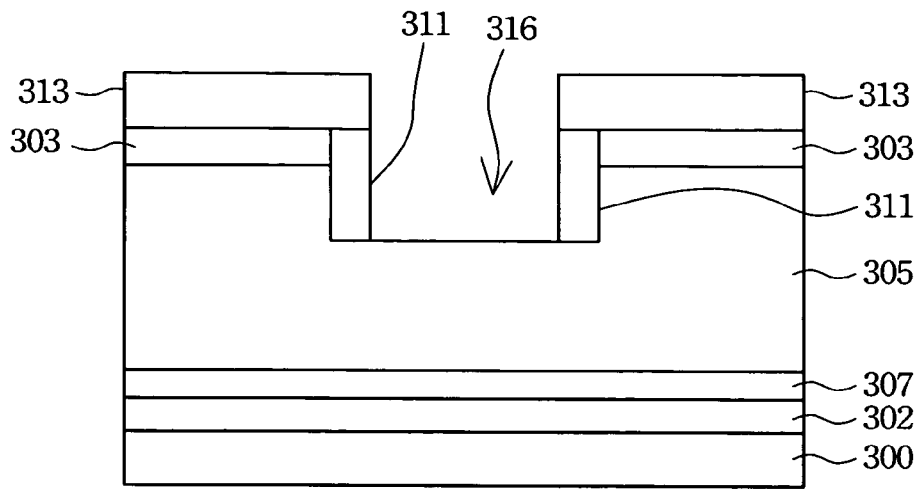
Figure 3E:
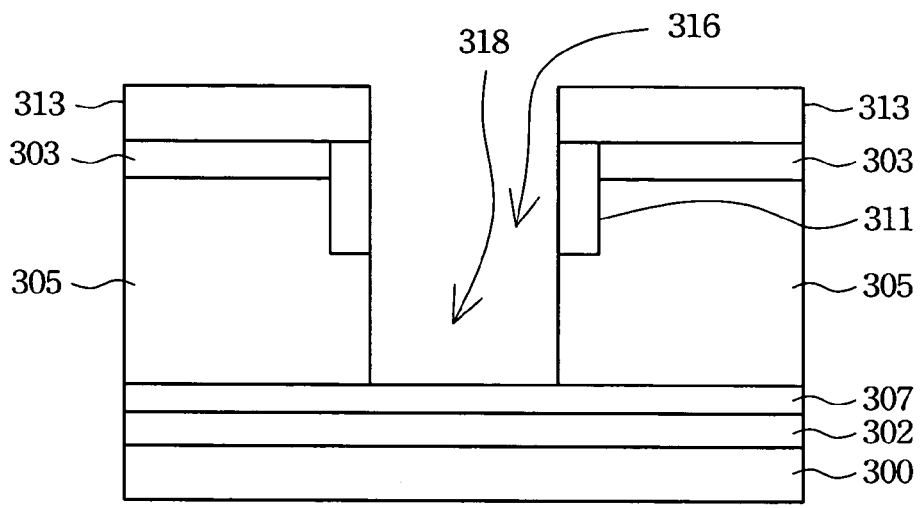
Figure 3F:
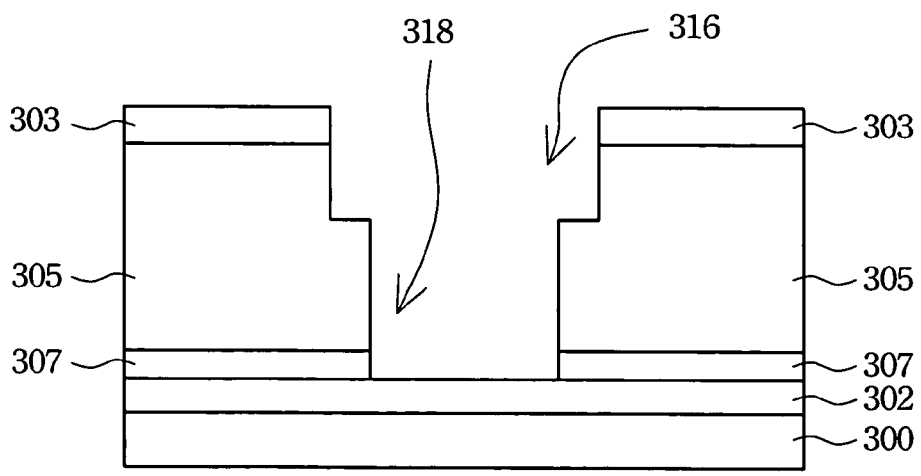

Referring to FIG. 3D and FIG. 3E, the patterned photoresist layer 313 is used as a mask for forming a via 318 by etching through the sacrificial layer 311 and the inter-metal dielectric layer 305 to the first etching stop layer 307. The photoresist layer 313 and the sacrificial layer 311 are then both removed by etching or by cleaning to build up a complete structure of the trench 316 and the via 318, as illustrated in FIG. 3F. On the other hand, less photoresist scum results from neutralization of the photoresist with NH— group components because of the greater open area of the trench.

Figure 3G:
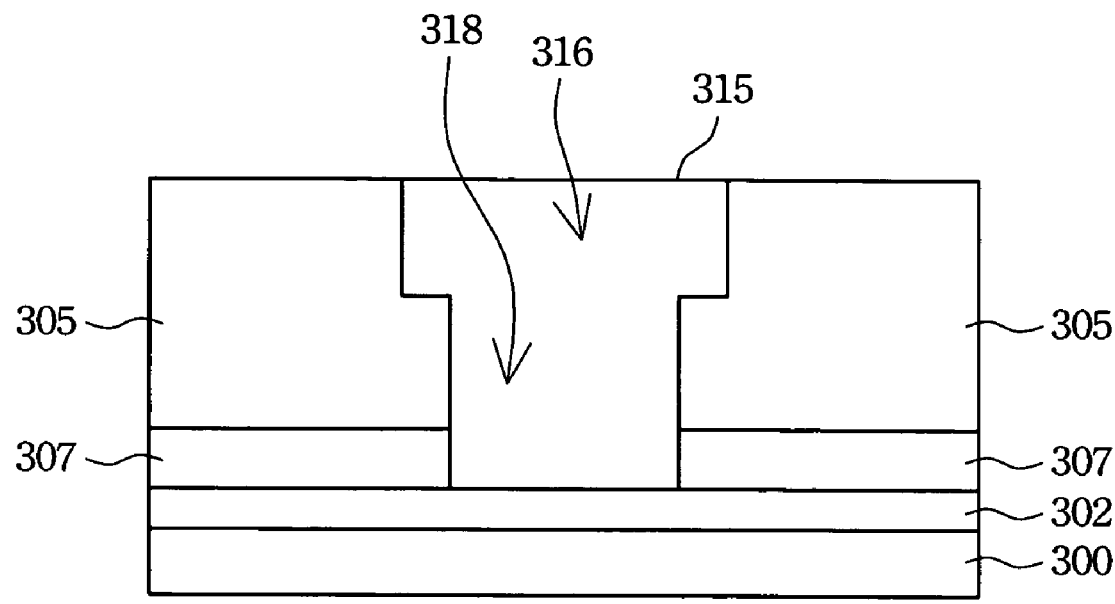

The first etching stop layer 307 is subsequently etched through to expose the first metal layer 302. Referring to FIG. 3G, the via 318 and the trench 316 are filled with a metal layer 315, and the metal layer 315 is then planarized to the thickness of the inter-metal dielectric layer 305. The first metal layer 302 and the metal layer 315 herein comprise, for instance, copper. It should be noted that the first etching stop layer 307 is not removed until the via 318 and the trench 316 are formed; therefore, Q-time when the metal layer 302 is exposed to the air is dramatically reduced. Moreover, a conventional post-baking step following etching a via is not essential at all, which leads to a simpler process.

Figure 3H:
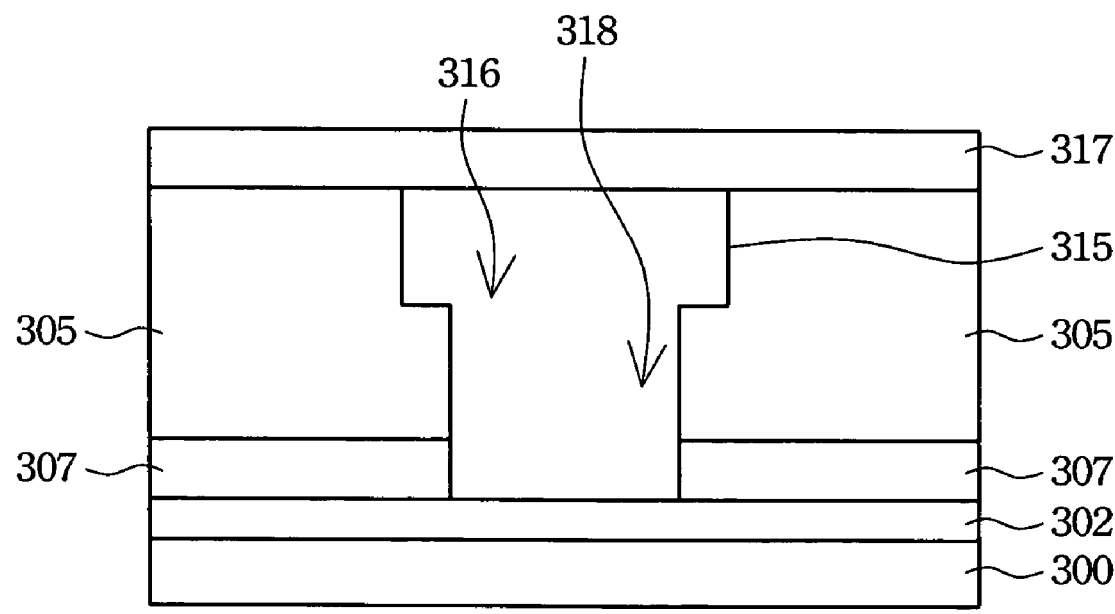

A third etching stop layer 317 is next formed on the metal layer 315 for subsequent processes, as illustrated in FIG. 3H.

According to the aforementioned preferred embodiment of the present invention, a method of manufacturing a dual damascene structure with a trench formed first is provided, which effectively improves the conventional art. For example, the micro trenches and the fences during the conventional process are eliminated by use of the proper sacrificial materials. The control windows of the photolithography process are increased by the step of planarizing the sacrificial materials. In addition, the photoresist scum is removed effectively due to the greater open area of the trench. On the other hand, the Q-time when the metal is exposed to the air is reduced, and the metal is consequently protected from oxidation, which is especially beneficial to copper processes. A post-baking step is further omitted in accordance with the present invention; hence the process is simplified.

While the invention has been particularly shown and described with reference to the preferred embodiments thereof, these are, of course, merely examples to help clarify the invention and are not intended to limit the invention. It will be understood by those skilled in the art that various changes, modifications, and alterations in forms and details may be made therein without departing from the spirit and scope of the invention, as set forth in the following claims.

What is claimed is:

1. A method for manufacturing dual damascene structure with a trench formed first, comprising the steps of:
    providing a substrate having a plurality of semiconductor devices;
    forming a first metal layer on the substrate;
    forming a first etching stop layer on the first metal layer;
    forming a dielectric layer on the first etching stop layer;
    forming a second etching stop layer on the dielectric layer;
    forming a first patterned photoresist layer on the second etching stop layer;
    forming a trench by etching though the second etching stop layer and stopping in the dielectric layer at a predetermined depth;
    filling with a sacrificial layer into the trench;
    planarizing the sacrificial layer;
    forming a second patterned photoresist layer on the sacrificial layer;
    forming a via by etching the sacrificial layer and the dielectric layer;
    removing the sacrificial layer and the second patterned photoresist layer;
    etching the first etching stop layer to expose the first metal layer;
    filling with a second metal layer; and
    planarizing the second metal layer.

2. The method of claim 1, wherein the first metal layer comprises copper.

3. The method of claim 1, wherein the second metal layer comprises copper.

4. The method of claim 1, wherein the dielectric layer is made of a material selected from a group consisting of fluorinated silicate glass (FSG), silicon dioxide, black diamond (BD), SiLK, CORAL, methyl silsesquioxane (MSQ), and hydrogen silsesquioxane (HSQ).

5. The method of claim 1, wherein the dielectric layer has a dielectric constant of about 1.0 to about 4.0.

6. The method of claim 1, wherein the predetermined depth is less than a thickness of the dielectric layer.

7. The method of claim 1, wherein the sacrificial layer is 0.5–1.5 times a thickness of the dielectric layer.

8. The method of claim 1, wherein an etching rate ratio of the sacrificial layer to the dielectric layer is about 0.7:1 to 1.3:1.

9. The method of claim 1, wherein the step of forming a via by etching the sacrificial layer and the dielectric layer is stopped at the first etching stop layer.

10. The method of claim 1, further comprising the step of:
    forming a third etching stop layer on the second metal layer for subsequent processes.

11. The method of claim 1, wherein the second patterned photoresist layer and the dielectric layer are separated by the sacrificial layer and the second etching stop layer.

12. The method of claim 1, wherein the first etching stop layer comprises a diffusion-barrier layer.

13. The method of claim 1, wherein the second etching stop layer comprises a hard mask layer.

14. The method of claim 1, wherein the second etching stop layer comprises an anti-reflection layer.

* * * * *